United States Patent
Huang

(10) Patent No.: US 12,306,546 B2
(45) Date of Patent: May 20, 2025

(54) METHOD FOR OVERLAY CONTROL BASED ON A SEMICONDUCTOR DEVICE PATTERN, AND METHOD AND SYSTEM FOR GENERATING A PHOTOMASK

(71) Applicant: Prosemi Co., Ltd., Tainan (TW)

(72) Inventor: Tian-Xing Huang, Tainan (TW)

(73) Assignee: PROSEMI CO., LTD., Tainan (TW)

( * ) Notice: Subject to any disclaimer, the term of this patent is extended or adjusted under 35 U.S.C. 154(b) by 601 days.

(21) Appl. No.: 17/667,067

(22) Filed: Feb. 8, 2022

(65) Prior Publication Data

US 2022/0252991 A1 Aug. 11, 2022

(30) Foreign Application Priority Data

Feb. 9, 2021 (TW) ................................. 110105044

(51) Int. Cl.
*G03F 7/00* (2006.01)
(52) U.S. Cl.
CPC .............................. *G03F 7/70633* (2013.01)
(58) Field of Classification Search
CPC .................................................. G03F 7/70633
USPC ....................................................... 430/22, 30
See application file for complete search history.

(56) References Cited

U.S. PATENT DOCUMENTS

| | | | | |
|---|---|---|---|---|
| 11,537,042 B2* | 12/2022 | Lee | .................. | G03F 7/2004 |
| 11,640,118 B2* | 5/2023 | Devilliers | ............. | G03F 9/7088 |
| | | | | 430/394 |
| 2022/0050393 A1* | 2/2022 | Devilliers | ............... | H01L 22/20 |
| 2022/0075276 A1* | 3/2022 | Mathijssen | ........... | G06T 7/0004 |
| 2022/0155693 A1* | 5/2022 | Volkovich | ........... | G03F 7/70683 |
| 2022/0252991 A1* | 8/2022 | Huang | ..................... | G03F 1/70 |
| 2024/0118628 A1* | 4/2024 | Wang | ................. | G03F 7/70633 |

* cited by examiner

*Primary Examiner* — Christopher G Young
(74) *Attorney, Agent, or Firm* — MUNCY, GEISSLER, OLDS & LOWE, P.C.

(57) ABSTRACT

A method for overlay control based on a semiconductor device pattern includes: obtaining data of selected area from the semiconductor device pattern that includes a wiring section with a first pattern image and a second pattern image that are images of two wiring patterns formed in different steps in a semiconductor fabrication process; obtaining two overlay errors associated with the first pattern image and the second pattern image on two different locations; calculating a calibration dimension based on either the overlay errors or a pre-set value; and generating a calibrated area based on the selected area and the calibration dimension.

15 Claims, 9 Drawing Sheets

METHOD FOR OVERLAY CONTROL BASED ON A SEMICONDUCTOR DEVICE PATTERN, AND METHOD AND SYSTEM FOR GENERATING A PHOTOMASK

CROSS-REFERENCE TO RELATED APPLICATION

This application claims priority of Taiwanese Patent Application No. 110105044, filed on Feb. 9, 2021.

FIELD

The disclosure relates to a method for overlay control based on a semiconductor device pattern, and a method and a system for generating a photomask.

BACKGROUND

As the field of semiconductor manufacturing progresses, the structure of semiconductor devices has become progressively complicated, multi-layered, and dense. During the manufacturing of the semiconductor device (in which a plurality of layers, each having a specific pattern, are laid in an order), when one of the layers is misaligned with a previous one of the layers, one or more layers that are to be formed after the one of the layers may be adversely affected, resulting in malfunctions such as connection failures and/or short circuits in the resultant semiconductor device. Accordingly, overlay control, which involves the control of layer-to-layer alignment of semiconductor devices, has become an important issue. In current semiconductor manufacturing processes that involve photolithography, the overlay control may involve using a metrology equipment to perform a number of measurements on a semiconductor device, including defining one or more overlay marks on one or more of layers of the semiconductor device, and calculating a displacement of the overlay marks (also known as an overlay error) on different layers so as to determine whether a compensation for the overlay error is needed for subsequent manufacturing processes.

It is noted that the overlay error may be caused by differences of the materials and/or pattern densities among different layers, which, during the manufacturing process, may expand or shrink at varying levels in view of temperature variations. While the scale of such a difference may be small (e.g., in the scale of nanometers), the potential adverse effects resulting from overlay error may become increasingly significant as the scales of the semiconductor device also become smaller. Furthermore, current metrology equipment may yet be capable of determining the overlay error in such small scales (i.e., smaller than hundreds of micrometers).

SUMMARY

Therefore, an object of the disclosure is to provide a method for overlay control based on a semiconductor device pattern for determining overlay errors in smaller scales (i.e., smaller than hundreds of micrometers).

According to one embodiment of the disclosure, the method for overlay control based on a semiconductor device pattern is implemented using a system and includes:
  obtaining data of a selected area from the semiconductor device pattern, the semiconductor device pattern including a wiring pattern section with a first pattern image and a second pattern image that are images of two wiring patterns formed in different steps in a semiconductor fabrication process;
  obtaining two overlay errors associated with the first pattern image and the second pattern image on two different locations;
  calculating a calibration dimension based on either the overlay errors or a pre-set value; and
  generating a calibration image with one dimension thereof equaling the calibration dimension, and generating a calibrated area based on the selected area and the calibration image.

Another object of the disclosure is to provide a method for generating a photomask for fabricating a semiconductor device with the aforementioned overlay errors compensated for.

According to one embodiment of the disclosure, the method for generating a photomask for fabricating a semiconductor device is implemented using a computing system and includes:
  obtaining data of a selected area from a semiconductor device pattern, the semiconductor device pattern including a wiring section with a first pattern image and a second pattern image that are images of two wiring patterns formed in different steps in a semiconductor fabrication process;
  obtaining two overlay errors associated with the first pattern image and the second pattern image on two different locations;
  calculating a calibration dimension based on either the overlay errors or a pre-set value;
  generating a calibration image with one dimension thereof equaling the calibration dimension, and generating a calibrated area based on the selected area and the calibration image; and
  converting the calibrated area into a data file in a data stream format for data exchange.

Another object of the disclosure is to provide a system that in capable of implementing the aforementioned method for overlay control based on a semiconductor device pattern.

According to one embodiment of the disclosure, the computing system includes:
  a data obtaining unit that is configured to obtain data of a selected area from the semiconductor device pattern, the semiconductor device pattern including a wiring section with a first pattern image and a second pattern image that are images of two wiring patterns formed in different steps in a semiconductor fabrication process;
  a computing unit that is configured to obtain two overlay errors associated with the first pattern image and the second pattern image on two different locations, and to calculate a calibration dimension based on either the overlay errors or a pre-set value;
  a calibration unit that is configured to generate a calibration image with one dimension thereof equaling the calibration dimension, and to generate a calibrated area based on the selected area and the calibration image.

Another object of the disclosure is to provide a method for overlay control based on a semiconductor device pattern for determining overlay errors in smaller scales (i.e., smaller than hundreds of micrometers).

According to one embodiment of the disclosure, the semiconductor device pattern is a simulated image of a semiconductor device in a specific stage of semiconductor fabrication process. The simulated image includes a wiring section with a first pattern image and a second pattern image that are images of two wiring patterns formed in different steps in a semiconductor fabrication process. The method is implemented using a system and includes:

obtaining two overlay errors associated with the first pattern image and the second pattern image on two different locations;

calculating a calibration dimension based on either the overlay errors or a pre-set value; and generating a calibration image with one dimension thereof equaling the calibration dimension, and generating a calibrated area based on the selected area and the calibration image.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
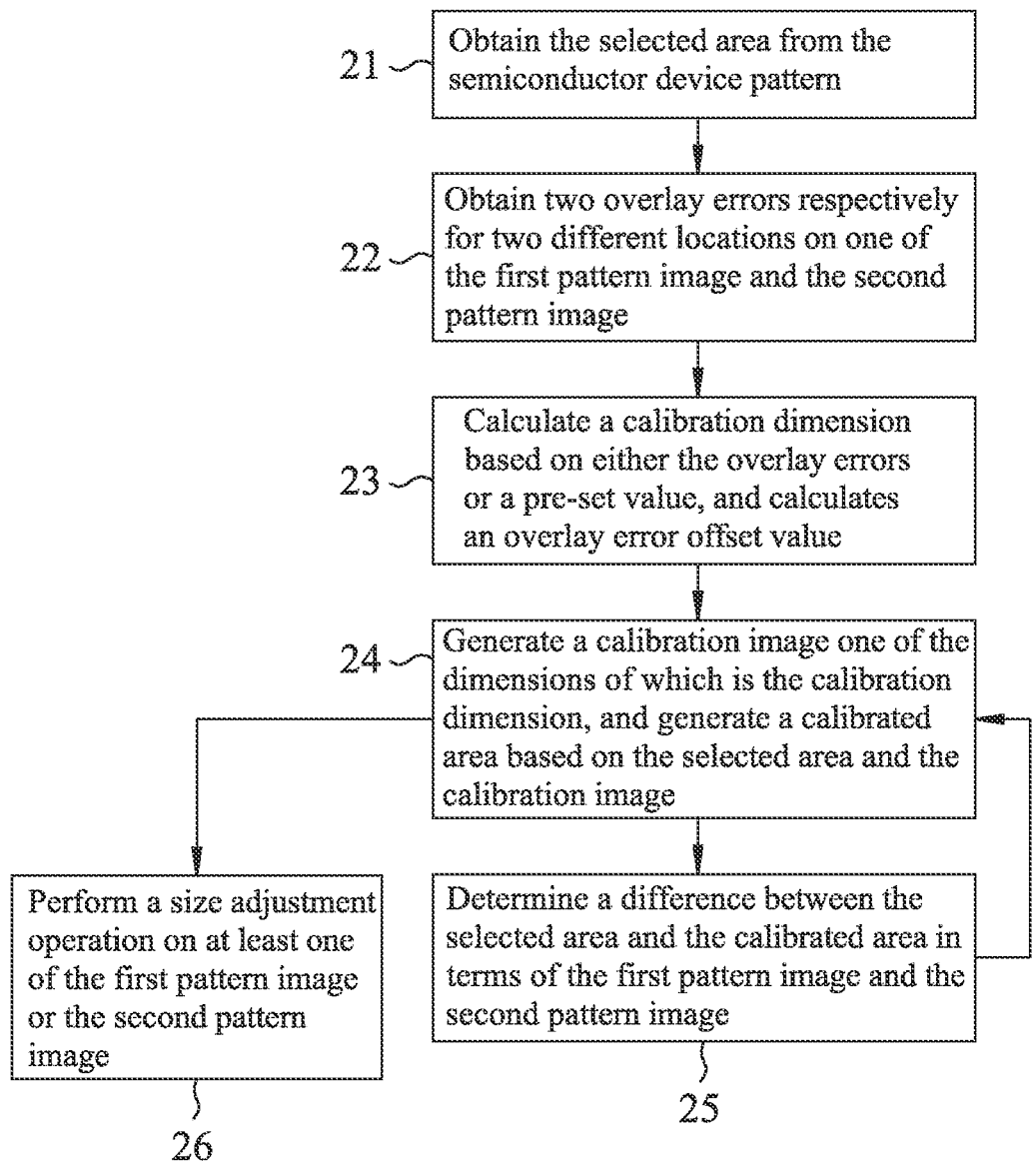
FIG. 1 is a flow chart illustrating steps of a method for overlay control according to one embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Throughout the disclosure, the term "coupled to" or "connected to" may refer to a direct connection among a plurality of electrical apparatus/devices/equipment via an electrically conductive material (e.g., an electrical wire), or an indirect connection between two electrical apparatus/devices/equipment via another one or more apparatus/devices/equipment, or wireless communication.

Figure 2:
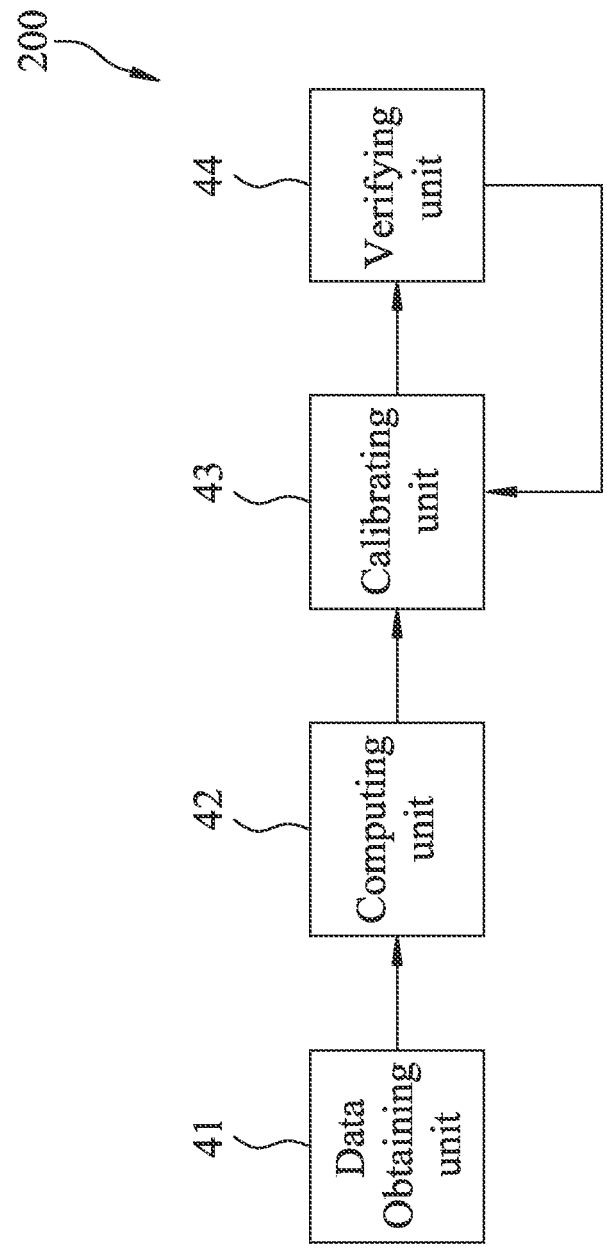
FIG. 2 is a block diagram illustrating a system that is configured to perform overlay control based on a semiconductor device pattern according to one embodiment of the disclosure.

FIG. 2 is a block diagram illustrating a system 200 that is configured to perform overlay control based on a semiconductor device pattern according to one embodiment of the disclosure.

In embodiments, the system 200 may be embodied based on a graphic data system (GDS), a manufacturing electron beam exposure system (MEBES), or other systems currently available. The system 200 includes a data obtaining unit 41, a computing unit 42 coupled to the data obtaining unit 41, a calibrating unit 43 coupled to the computing unit 42, and a verifying unit 44 coupled to the calibrating unit 43.

Figure 3:
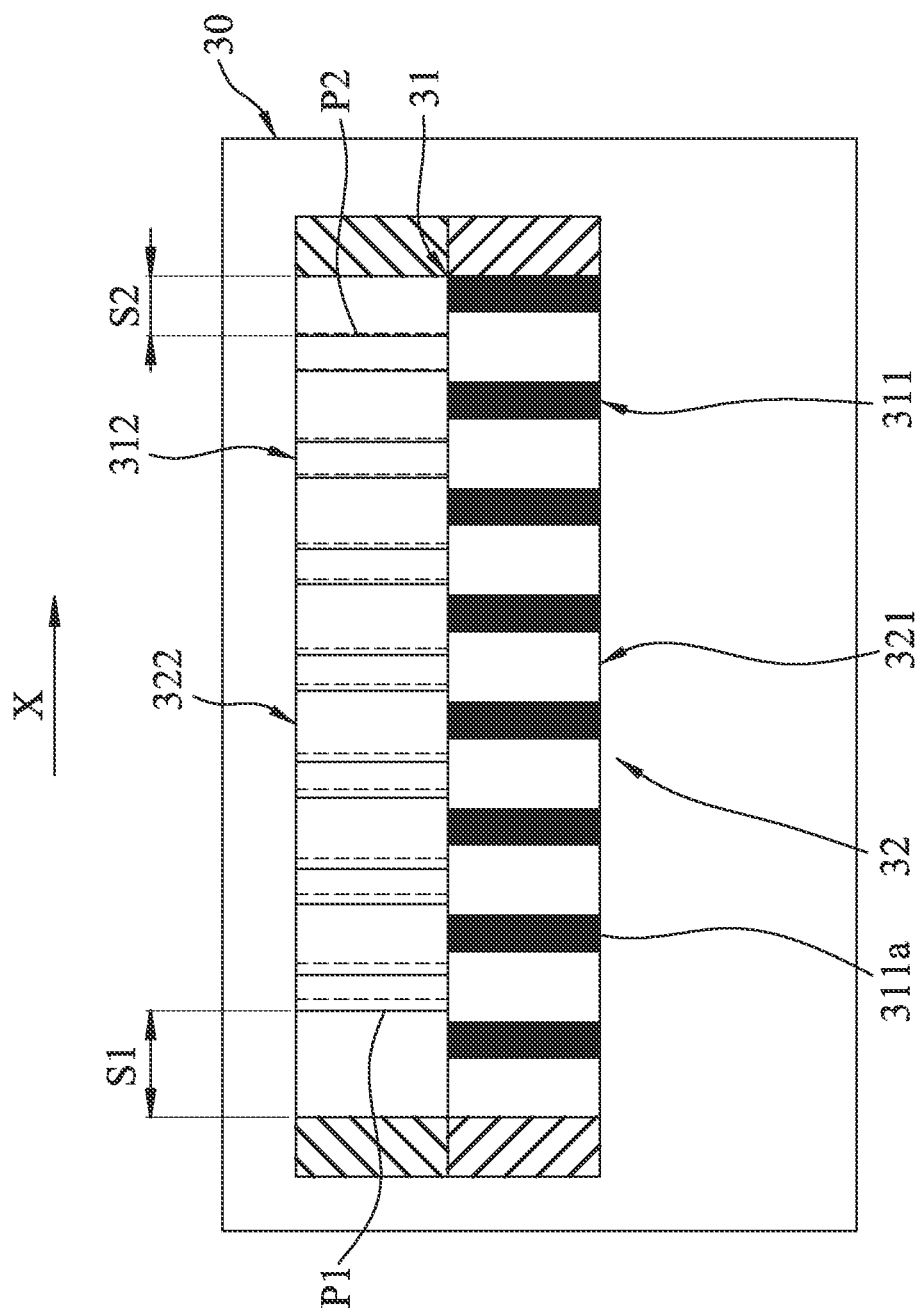
FIG. 3 illustrates an exemplary selected area, which is a sectional view of a semiconductor device depicted in the semiconductor device pattern according to one embodiment of the disclosure.

The data obtaining unit 41 may be embodied using a stepper, a scanner, a diffractometer, an electron microscope, an optical microscope or other optical imaging equipment, and is capable of obtaining data of an image of a selected area 30 of a semiconductor device pattern (see FIG. 3). In this embodiment, the semiconductor device pattern is an image of a fabricated semiconductor device obtained using a stepper, a scanner, a diffractometer, an electron microscope, an optical microscope or other optical imaging equipment.

FIG. 3 illustrating an exemplary selected area 30, which depicts an image of a sectional view of a semiconductor device, according to one embodiment of the disclosure. The selected area 30 in this embodiment includes a wiring pattern section 31 and a non-wiring section 32.

The wiring pattern section 31 includes at least a first pattern image 311 and a second pattern image 312. Specifically, the first pattern image 311 and the second pattern image 312 are images of two wiring patterns formed in different steps in a semiconductor fabrication process (and are formed in two overlaying layers in this embodiment), and are to be arranged with respect to each other in a designated arrangement. Each of wiring patterns that correspond to the first pattern image 311 or the second pattern image 312 includes a number of wiring parts.

The non-wiring section 32 may be images of supporting materials that form supporting layers of the semiconductor device, and that are distributed among the wiring parts. The non-wiring section 32 and the wiring pattern section 31 cooperatively form the selected area 30. In this embodiment, the non-wiring section 32 includes a third pattern image 321 that corresponds with the first pattern image 311, and a fourth pattern image 322 that corresponds with the second pattern image 312.

In other words, the selected area 30 may be said to include images of: a first layer that includes wiring parts corresponding to the first pattern image 311 and the supporting material corresponding to the third pattern image 321, which are alternately arranged along a direction (e.g., the direction X in FIG. 3); and a second layer that includes wiring parts corresponding to the second pattern image 312 and the supporting material corresponding to the fourth pattern image 322, which are alternately arranged along the direction.

It is noted that a supporting material used to form the supporting layer in the first layer may be different from that used to form the supporting layer in the second layer.

In use, the semiconductor fabrication process may involve the operations of: forming a supporting layer using a supporting material (e.g., a dielectric material or an insulating material); forming a photomask on top of the supporting layer, wherein the photomask has a first pattern which corresponds to the third pattern image 321; etching the supporting layer via the photomask to form a number of recesses in the supporting layer along a direction X; forming the wiring parts in the recesses of the supporting layer to form the wiring pattern that corresponds to the first pattern image 311, thereby forming a first layer; forming another supporting layer using a supporting material (e.g., a dielectric material or an insulating material) on a top surface of the first layer; forming another photomask on top of the another supporting layer, where the another photomask has a second pattern that corresponds to the fourth pattern image 322;

etching the another supporting layer via the another photomask to form a number of recesses in the another supporting layer along the direction X; and forming the wiring parts in the recesses of the another supporting layer to form the wiring pattern of the second pattern image 312, thereby forming the second layer.

It is noted that during the semiconductor fabrication process, the semiconductor device may be heated and cooled multiple times, and as a result, the supporting materials may expand or shrink. In the case where the supporting materials for the two supporting layers expand or shrink to different extents, the first pattern image 311 and the second pattern image 312 may deviate from the designated arrangement. In the example of FIG. 3, the solid lines define a number of locations the wiring parts in the second pattern image 312 are expected to be at in the designated arrangement, and the dotted lines define a number of locations where the wiring parts in the second pattern image 312 actually are, representing an actual arrangement. A displacement in one or both of the first pattern image 311 and the second pattern image 312, between a first position where a corresponding one of the wiring parts is to be located based on the designated arrangement and a second position where the corresponding one of the wiring parts is actually located is referred to as an "overlay error" associated with the first pattern image 311 and the second pattern image 312.

The computing unit 42 may include, but not limited to, one or more of a single core processor, a multi-core processor, a dual-core mobile processor, a microprocessor, a microcontroller, a digital signal processor (DSP), a field-programmable gate array (FPGA), an application specific integrated circuit (ASIC), a radio-frequency integrated circuit (RFIC), etc.

In use, the computing unit 42 may be configured to obtain two overlay errors respectively for two different locations on either the first pattern image 311 or the second pattern image 312 of the wiring pattern section 31, and to calculate a calibration dimension based on either the overlay errors respectively for the two different locations or a pre-set value.

The calibrating unit 43 is configured to generate a calibration image with one dimension equaling the calibration dimension, and to generate a calibrated area based on the selected area 30 and the calibration image. It is noted that the calibration image has two dimensions, and in embodiments, one dimension (i.e., one of the two dimensions) of the calibration image (e.g., along the direction X) is generated to be equal to the calibration dimension. In embodiments, the calibrating unit 43 may be a microprocessor that executes a software program to perform the operations, but is not limited as such.

The verifying unit 44 may be configured to obtain two overlay errors on two different locations of either the first pattern image 311 or the second pattern image 312 in the calibrated area, to determine a difference between the selected area and the calibrated area. While in this embodiment, the verifying unit 44 is a component separate from the computing unit 42, in other embodiments, the verifying unit 44 and the computing unit 42 may be integrated as a single component. In some embodiments, the verifying unit 44 may be a microprocessor that executes a software program to perform the operations, but is not limited as such.

FIG. 1 is a flow chart illustrating steps of a method for overlay control according to one embodiment of the disclosure. In this embodiment, the method is implemented using the system 200 as shown in FIG. 2.

In step 21, the data obtaining unit 41 obtains the selected area 30 from the semiconductor device pattern.

In step 22, the computing unit 42 obtains two overlay errors respectively for two different locations on one of the first pattern image 311 and the second pattern image 312 (in this embodiment, the second pattern image 312).

Specifically, in this embodiment, the computing unit 42 is configured to obtain two overlay errors respectively on two side points of the wiring pattern section 31 (indicated by P1 and P2 in FIG. 3). In embodiments, the overlay errors may be obtained using a known manner, and details thereof are omitted herein for the sake of brevity.

It is noted that, since the overlay errors may be in the scale of micrometers or even nanometers and may be difficult to measure accurately, in embodiments, two different overlay errors are measured individually because overlay errors resulting from the expansion of the supporting material may be more substantial along a given direction (e.g., from a left side of the second pattern image 312, the overlay errors of each part reduce along the direction X in FIG. 3). As a result, by determining two different overlay errors respectively on two side points of the same pattern image, a trend of variation in overlay errors along the given direction may also be obtained.

It is noted that while in this embodiment, the semiconductor device pattern is an image of the semiconductor device, in other embodiments, the semiconductor device pattern may be in the form of other data formats, or in the form of a simulated image of the semiconductor device generated using a GDS with a number of process parameters that are to be used for simulating an actual semiconductor fabrication process such as a film stress, a thermal expansion coefficient, etc. The simulated image may similarly include a wiring pattern section with a first pattern image and a second pattern image that are images of two wiring patterns formed in different steps in a semiconductor fabrication process.

As a result, in some embodiments, the operations of steps 21 and 22 may be done by operating the GDS (or MEBES or other applicable systems) to obtain the simulated image of the first pattern image 311 and the second pattern image 312 in a specific stage of the semiconductor fabrication process, and calculating the overlay errors based on the simulated image, instead of the images of the actual semiconductor device, by executing a software application for overlay control.

In step 23, the computing unit 42 calculates a calibration dimension based on either the overlay errors obtained in step 22 or a pre-set value, and calculates an overlay error offset value. The pre-set value may be a tolerance-related dimension associated with the semiconductor fabrication process or a user-defined value.

Specifically, in this embodiment, the calibration dimension indicates a length along the direction X, and is calculated by dividing a difference between the overlay errors obtained in step 22 by the number (P*n), or by dividing the pre-set value by the number (P*n), where P represents a predetermined resolution associated with an electron beam used for obtaining the semiconductor device pattern, or a resolution associated with a size of a pixel, and n is a positive integer and may represent a number of wiring parts in the second pattern image 312 (in the example of FIG. 3, the number n may be seven).

The overlay error offset value in this embodiment is calculated by taking an average value of the overlay errors obtained in step 22. In other words, the overlay error offset value may be taken to mean a displacement of a middle point of said one of the first pattern image 311 and the second pattern image 312 (the second pattern image 312 in this embodiment) with respect to the designated arrangement.

In step 24, the calibrating unit 43 generates a calibration image one of the dimensions of which is the calibration dimension, and generates a calibrated area based on the selected area 30 and the calibration image. Specifically, in this embodiment, the calibration image has a width identical to the calibration dimension along the direction X and a length identical to a length of the second pattern image 312 in a direction perpendicular to the direction X, but is not limited as such.

In embodiments, the calibrating unit 43 may execute a software program to perform the operations of step 24.

Specifically, the calibrating unit 43 is configured to generate a calibrated area by inserting one or more calibration images in the selected area 30, or removing one or more parts of the selected area 30, each with a size identical to that of the calibration image.

In the example of FIG. 3, the designated arrangement indicates that the wiring parts in the second pattern image 312 are not evenly distributed along the direction X (a range S1 between a left edge of the second pattern image 312 and a leftmost one of the wirings parts is longer than a range S2 between a right edge of the second pattern image 312 and a rightmost one of the wiring parts).

In such a case, after the second layer is formed, during the subsequent steps of semiconductor fabrication process such as thin film deposition and heating, the supporting material in the range S1 and the supporting material in the range S2 in the second layer may expand differently, causing the wiring parts in the second pattern image 312 to be shifted along the direction X with respect to the first pattern image 311. It is noted that, in the second pattern image 312, a displacement (overlay error) of the leftmost one of the wirings parts is the largest, and a displacement (overlay error) of the rightmost one of the wirings parts is the smallest.

In another case, during the subsequent steps of the semiconductor fabrication process such as thin film deposition and heating, the supporting material in the range S1 and the supporting material in the range S2 in the second layer may shrink to different extents, causing the wiring parts in the second pattern image 312 to be shifted along the direction X with respect to the first pattern image 311.

In embodiments, since for different wiring parts of the second pattern image 312, the associated overlay errors are different, the calibrating unit 43 may be configured to remove a plurality of parts with a size identical to that of the calibration image from different locations of the fourth pattern image 322, or insert a plurality of calibration images to different locations of the fourth pattern image 322 of the selected area 30. In some embodiments, the calibrating unit 43 may alternatively remove a plurality of parts with a size identical to that of the calibration image from different locations of the third pattern image 321, or insert a plurality of calibration images to different locations of the third pattern image 321 of the selected area 30. In some embodiments, the generation of the calibrated area may involve insertion of the calibration image or removal of the parts with respect to both the third pattern image 321 and the fourth pattern image 322.

The operations of inserting the calibration image or removing the parts aim to make each of the wiring parts in the second pattern image 312 shift with respect to the first pattern image 311 by a distance that is identical to the corresponding overlay error, and to make a middle point of the second pattern image 312 shift with respect to the first pattern image 311 by a distance that is identical to the overlay error offset value. As such, the resulting calibrated area may be generated to offset the displacement of said one of the first pattern image 311 and the second pattern image 312 (i.e., the second pattern image 312 in this embodiment) with respect to the designated arrangement, as attributed to the semiconductor fabrication process.

In embodiments, the calibrated area may then be stored in a storage medium (not depicted in the drawings) that may be embodied using, for example, random access memory (RAM), read only memory (ROM), programmable ROM (PROM), firmware, flash memory, etc.

In step 25, the verifying unit 44 determines two overlay errors respectively for two different locations on one of the first pattern image 311 and the second pattern image 312 of the calibrated area. This operation is implemented in a manner similar to that of step 22. It is expected that after the operations of step 24, the resulting calibrated area has the first pattern image 311 and the second pattern image 312 properly arranged (in the designated arrangement), and thus the overlay errors determined in step 25 should be less than a tolerance. That is to say, the operations of step 25 are to determine a difference between the selected area 30 and the calibrated area in terms of the first pattern image 311 and the second pattern image 312. In the cases where the resulting calibrated area does not have the first pattern image 311 and the second pattern image 312 properly arranged, a number of parameters used in the software application may then be adjusted based on the determination of step 25.

It is noted that in some embodiments, the operations of step 25 may be omitted.

Figure 4:
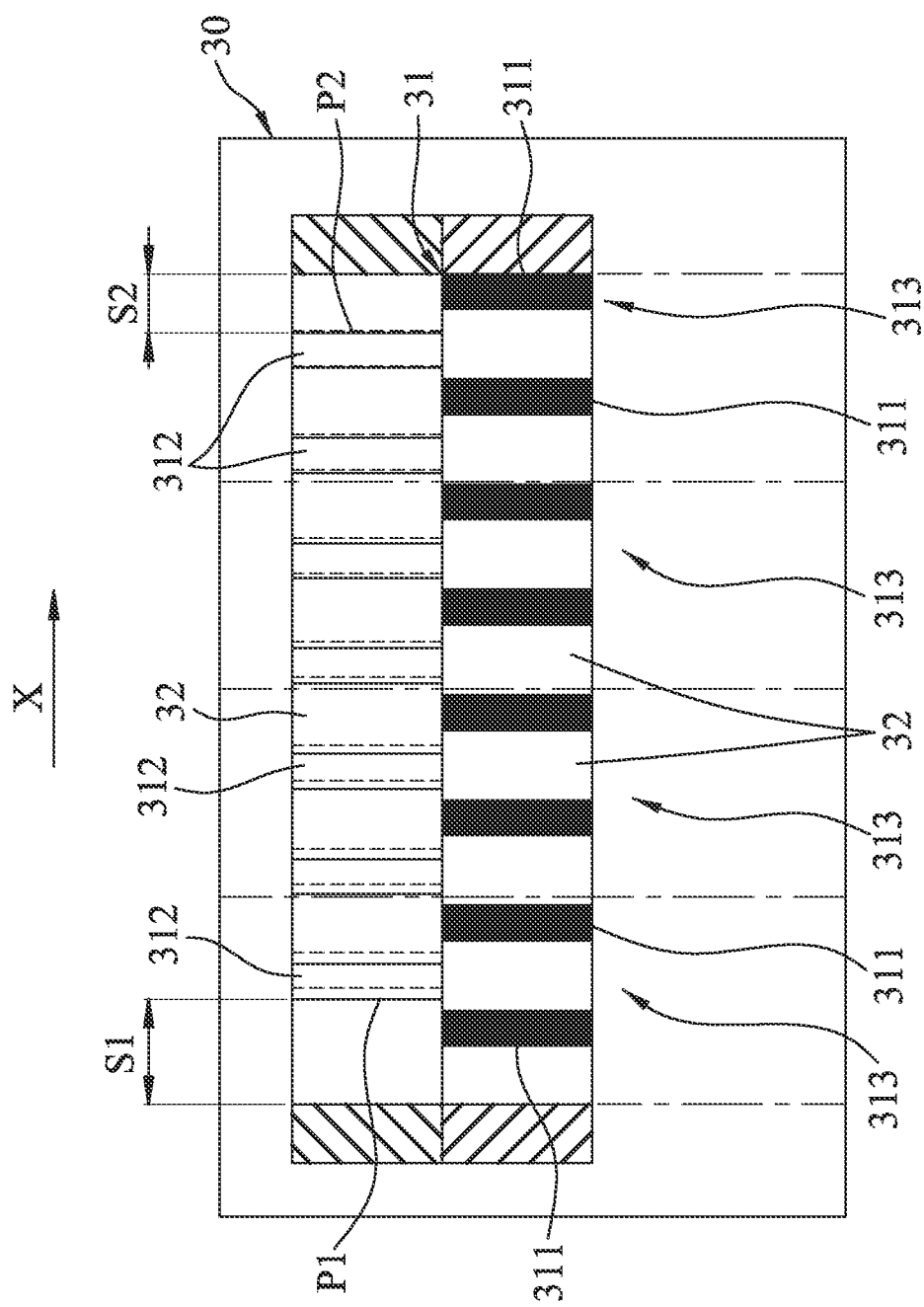
FIG. 4 is similar to FIG. 3, illustrating an exemplary selected area divided into a plurality of divided sections according to one embodiment of the disclosure.

In one embodiment, step 24 may further include dividing the selected area 30 along the direction X into a number (m) of divided sections 313 (see FIG. 4), and the operation of generating a calibrated area includes inserting at least one calibration image in one of the divided sections 313, or removing one or more parts, each with a size identical to that of the calibration image, from one of the divided sections 313 of the selected area. In some embodiments, the operation of generating a calibrated area includes inserting at least one calibration image in each of the divided sections 313, or removing one or more parts from each of the divided sections 313 of the selected area, each with a size identical to that of the calibration image.

The number (m) may be selected to satisfy the following relations:

$$|(m*n*P)-E|<n*P; \text{ and}$$

$$(m-1)*nP<E<(m+1)*nP$$

where E represents the difference between the two overlay errors thus calculated or the pre-set value.

In embodiments, since the calibration dimension calculated in step 23 is typically very small in scale (e.g., within the range of about 1 nanometer to about 4 nanometers), by performing the inserting or removing operation with respect to each of the divided sections 313, individual calibrations are performed with respect to the divided sections 313, and a resulting calibration image may be more accurate.

In some embodiments, the number (m) is selected to be equal to or greater than two, and the operations of step 24 include inserting at least two calibration images in the selected area 30.

Figure 5:
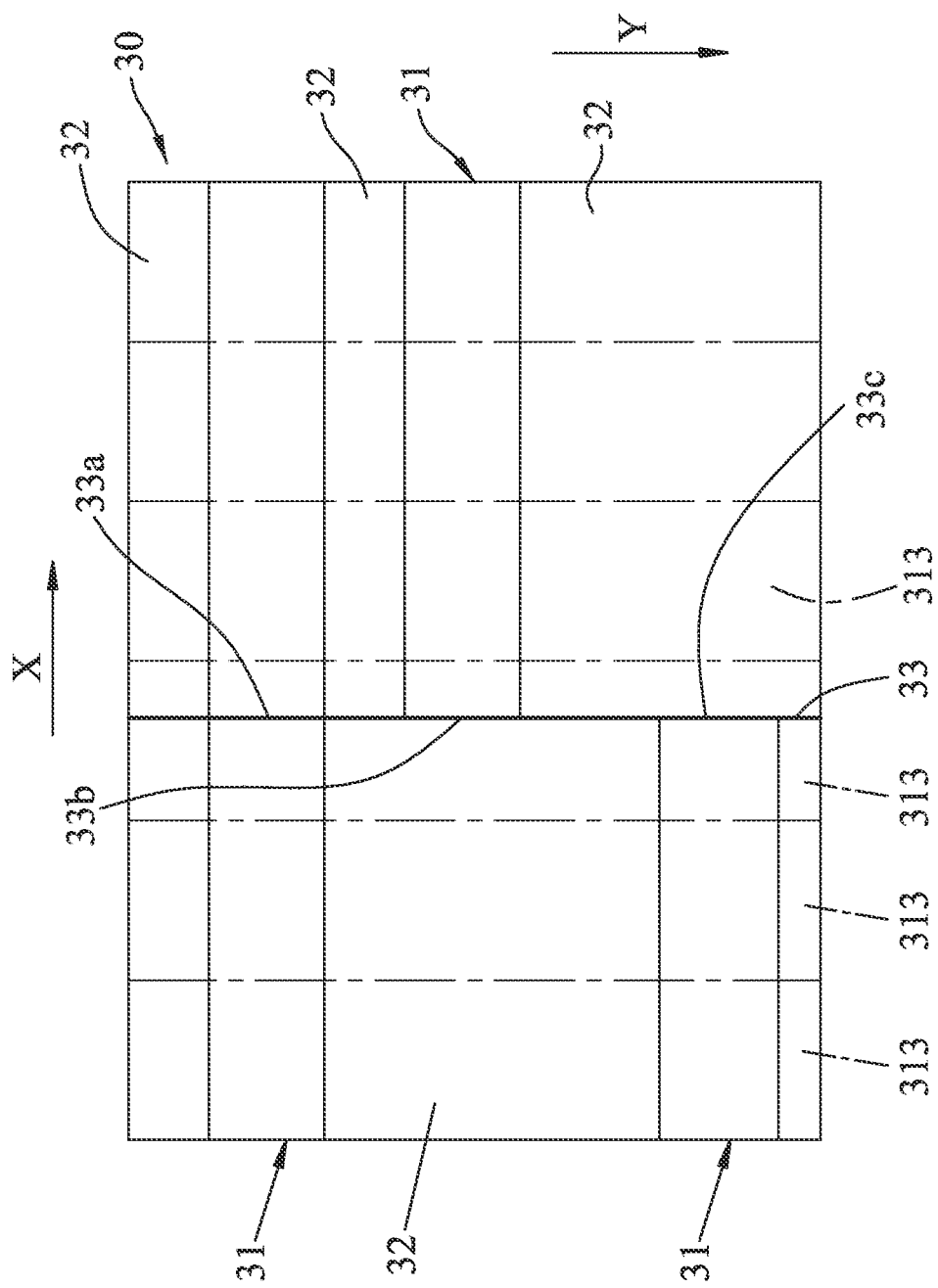
FIG. 5 illustrates an exemplary selected area, which is a top view of a semiconductor device depicted in the semiconductor device pattern and which is divided into a plurality of divided sections according to one embodiment of the disclosure.

In some embodiments, the selected area 30 may have a form as shown in FIG. 5. In FIG. 5, the selected area 30 includes a plurality of wiring pattern sections 31 and a plurality of non-wiring pattern sections 32. Each of the wiring pattern sections 31 may be in the form as shown in FIG. 3, extends along the direction X, and the wiring pattern sections 31 are arranged in a direction Y perpendicular to the direction X. The selected area 30 in this embodiment is divided along the direction X into a number (m) of divided sections 313.

In the embodiment of FIG. 5, the operations of step 24 may include first defining a reference line 33 that extends along the direction Y on the selected area 30 and that extends through at least one of the wiring pattern sections 31. Then, the calibrating unit 43 is configured to insert at least one calibration image at a calibration position in proximity to the reference line 33 within at least one of the wiring pattern sections 31 (labelled in a circle in FIG. 5), or removing one or more parts, each with a size identical to that of the calibration image, from the at least one of the wiring pattern sections 31 at the calibration position.

Then, along the reference line 33, a number of situations may occur based on the components crossed by the reference line 33, wherein each situation may be dealt with using a corresponding one of various calibration operations.

Specifically, a segment 33a of the reference line 33 crosses one of the wiring pattern sections 31, a segment 33b of the reference line 33 extends along an interface of one of the wiring pattern sections 31 and one of the non-wiring pattern sections 32 (that is, the one of the non-wiring pattern sections 32 is located on the left of the segment 33b, and the one of the wiring pattern sections 31 is located on the right of the segment 33b), and a segment 33c of the reference line 33 extends along an interface of the wiring pattern sections 31 and one of the non-wiring pattern sections 32 (that is, the one of the non-wiring pattern sections 32 is located on the right of the segment 33c, and the one of the wiring pattern sections 31 is located on the left of the segment 33c).

In the case of the segment 33a, the calibrating unit 43 may first determine whether the segment 33a extends through a wiring part in one of the first pattern image 311 and the second pattern image 312 (e.g., the second pattern image 312), or extends through a non-wiring section. The calibration image that is to be generated will have a characteristic that is determined based on the above determination as to whether the segment extends through a wiring part or a non-wiring section.

Specifically, when it is determined that the segment 33a extends through a wiring part, the calibrating unit 43 generates the calibration image that corresponds with the wiring part (that is, what is contained in the calibration image that is to be inserted or removed is to have a material that is the same as the wiring part, such as the second pattern image 312, indicating that the wiring part is to be expanded or partially removed so as to have a misalignment compensated for). Otherwise, when it is determined that the segment 33a extends through a non-wiring section, the calibrating unit 43 generates the calibration image that corresponds with the non-wiring section (that is, what is contained in the calibration image that is to be inserted or removed is to have a material that is the same as the non-wiring section (e.g., the supporting material), also known as a "blank", indicating that the non-wiring section is to be expanded or partially removed so as to have a misalignment compensated for), and performs the inserting or removing as described in the previous embodiments.

In the case of the segments 33b and 33c, the calibrating unit 43 may proceed to generate the calibration images with the characteristic that corresponds with either the wiring part (and thus the wiring pattern sections 31) or the non-wiring section (and thus the non-wiring pattern sections 32), and to perform the inserting or removing as described in the previous embodiments.

It is noted that in some embodiments, with respect to one specific reference line 33, for all those cases where the corresponding segment of the reference line 33 is at an interface of one of the wiring pattern sections 31 and one of the non-wiring pattern sections 32, the calibration images generated all have the same characteristic. In some embodiments, for all those cases in which the corresponding segment of the reference line 33 is at an interface of one of the wiring pattern sections 31 and one of the non-wiring pattern sections 32, the characteristic of the calibration images generated corresponds with either the wiring pattern section 31 or the non-wiring pattern section 32.

The above operations may be done with multiple reference lines 33 in different divided sections 313, and a resulting calibrated area may be generated.

In some embodiments, the method further includes, after step 24, a step 26 in which the calibrating unit 43 performs a size adjustment operation on at least one of the first pattern image 311 or the second pattern image 312 that has a size thereof altered due to the operations of step 24, such that a resulting size of the at least one of the first pattern image 311 or the second pattern image 312 in the calibrated area is consistent with the size of the at least one of the first pattern image 311 or the second pattern image 312 in the selected area 30.

Figure 6:
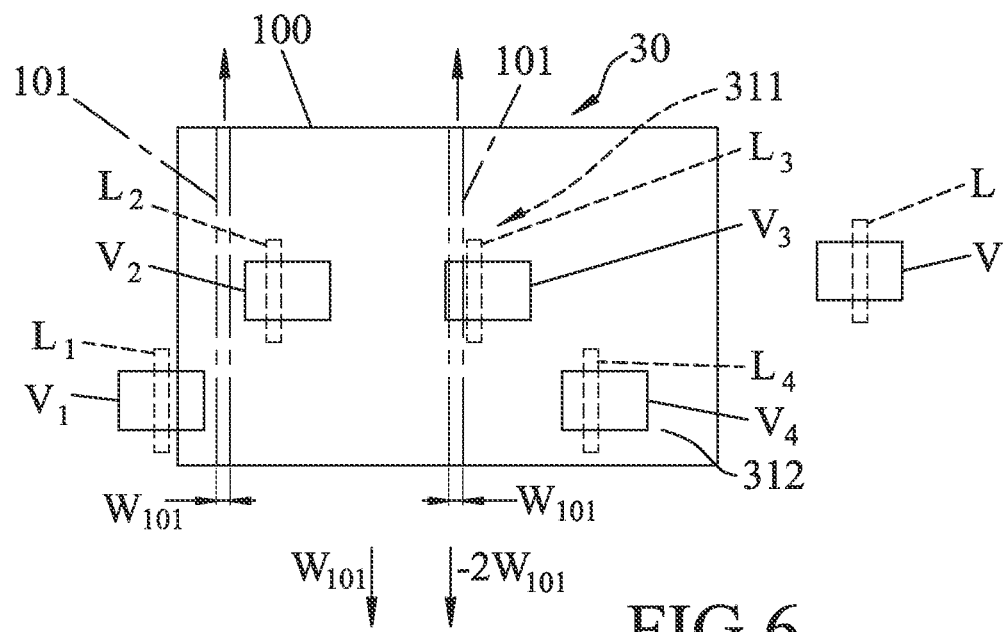
FIGS. 6-8 illustrate a size adjustment operation according to one embodiment of the disclosure.
Figure 7:
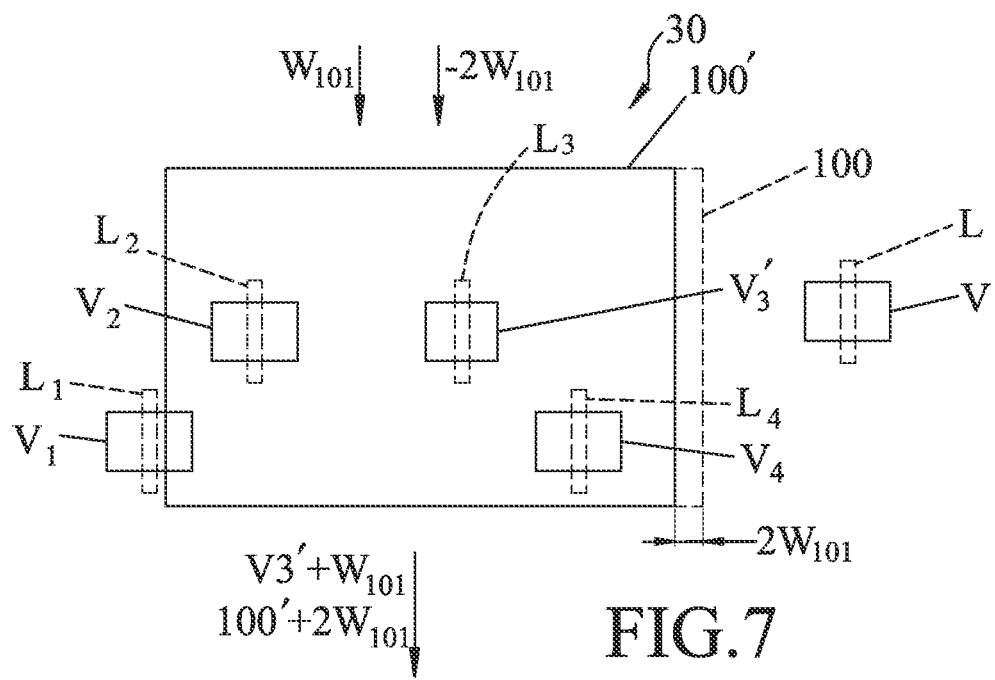
Figure 8:
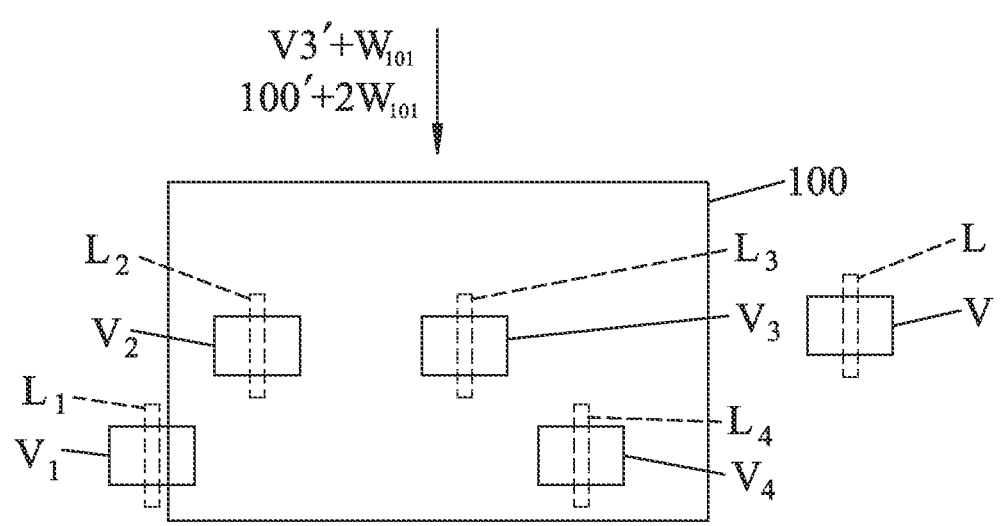

FIGS. 6-8 are top views illustrating the size adjustment operation implemented on another exemplary selected area taken from the semiconductor device pattern according to one embodiment of the disclosure.

In the example of FIG. 6, the first pattern image 311 may be in the form of a number of wiring parts (L), and the second pattern image 312 may be in the form of a number of through holes (V). The wiring parts (L) and the through holes (V) are formed in two different layers. For example, the through holes (V) may be formed in a top layer 100 of the semiconductor device, and the wiring parts (L) may be formed in a bottom layer that is directly below the top layer 100. For the sake of clear illustration, the through holes (V) are depicted using solid lines, and the wiring parts (L) are depicted using dotted lines.

In use, a selected area 30 may be in the form as shown in FIG. 6, and includes four wiring parts ($L_1$ to $L_4$) and four through holes ($V_1$ to $V_4$) corresponding respectively to the four wiring parts ($L_1$ to $L_4$). It is desirable to have each of the wiring parts (L) extend through a center of the corresponding one of the through holes (V).

In this example, the operations of step 24 regarding the selected area 30 of FIG. 6 may involve removing two sections 101 of the top layer 100, a dimension of each of which (a distance along the direction X) equals a calibration dimension of $W_{101}$. As a result, as shown in FIG. 7, a size of the top layer 100 is shrunk by a distance of $2*W_{101}$ (as indicated by the label 100') in the direction X, the through hole ($V_2$) is moved to the left by a distance of $W_{101}$, the through hole ($V_3$) is moved to the left by a distance of $W_{101}$ and is shrunk by a distance of $W_{101}$, and the through hole ($V_4$) is moved to the left by a distance of $2*W_{101}$. In this manner, each of the wiring parts (L) are now arranged to extend through the center of the corresponding one of the through holes (V), as shown in FIG. 7.

It is noted however that the size of the through hole ($V_3'$) is now reduced and is different from other through holes ($V_1$, $V_2$, $V_4$), and the size of the top layer 100' is also changed. As such, the operations of step 26 may include inserting one or more calibrated images in the top layer 100', with a dimension of the calibrated images (a distance along the direction X), combined, equaling $2*W_{101}$.

More specifically, the operations of step 26 may include inserting one or more calibrated images in the top layer 100' in a part that corresponds to the through hole ($V_3'$) where a combined dimension along the direction X of the one or more calibrate images is $W_{101}$, and inserting one or calibrated images in the top layer 100' in another part where a combined dimension along the direction X of the one or more calibrate images is $W_{101}$. In the example of FIG. 8, the operations of step 26 include inserting two calibrated images in the top layer 100', each with a dimension along the direction X of $0.5*W_{101}$, at two sides of the through hole ($V_3'$) and inserting another calibrated image in the top layer 100' at a right side of the top layer 100', with a dimension along the direction X of $W_{101}$. In total, the calibrated images inserted into the top layer 100' has a combined dimension of $2*W_{101}$. In this manner, the resulting sizes of the through holes ($V_1$-$V_4$) and the top layer 100 may be consistent before step 24 and after step 26.

It is noted that in other embodiments, when the operations of step 24 involve inserting one or more calibrated imaged in one of the at least one of the first pattern image 311 or the second pattern image 312 in the selected area 30, the operations of step 26 may include removing one or more calibrated images from the one of the at least one of the first pattern image 311 or the second pattern image 312 in the selected area 30.

In some embodiments, the operations of step 26 may be implemented such that an alignment of a center of the wiring part ($L_3$) and the corresponding through hole ($V_3$) remains consistent before step 24 and after step 26. That is to say, as seen in FIGS. 7 and 8, the through hole ($V_3$) is shaped such that the wiring part ($L_3$) consistently extends through the center the through hole ($V_3$). In some embodiments, the operations of step 26 may be implemented such that an alignment of a center of each of the wiring parts ($L_1$-$L_4$) and the corresponding through hole ($V_1$-$V_4$) remains consistent before step 24 and after step 26.

It is noted that after the method of FIG. 1 is implemented, the resulting calibrated area may be utilized to create a photomask for subsequent fabrication of new semiconductor devices with better layer-to-layer arrangement.

Figure 10:
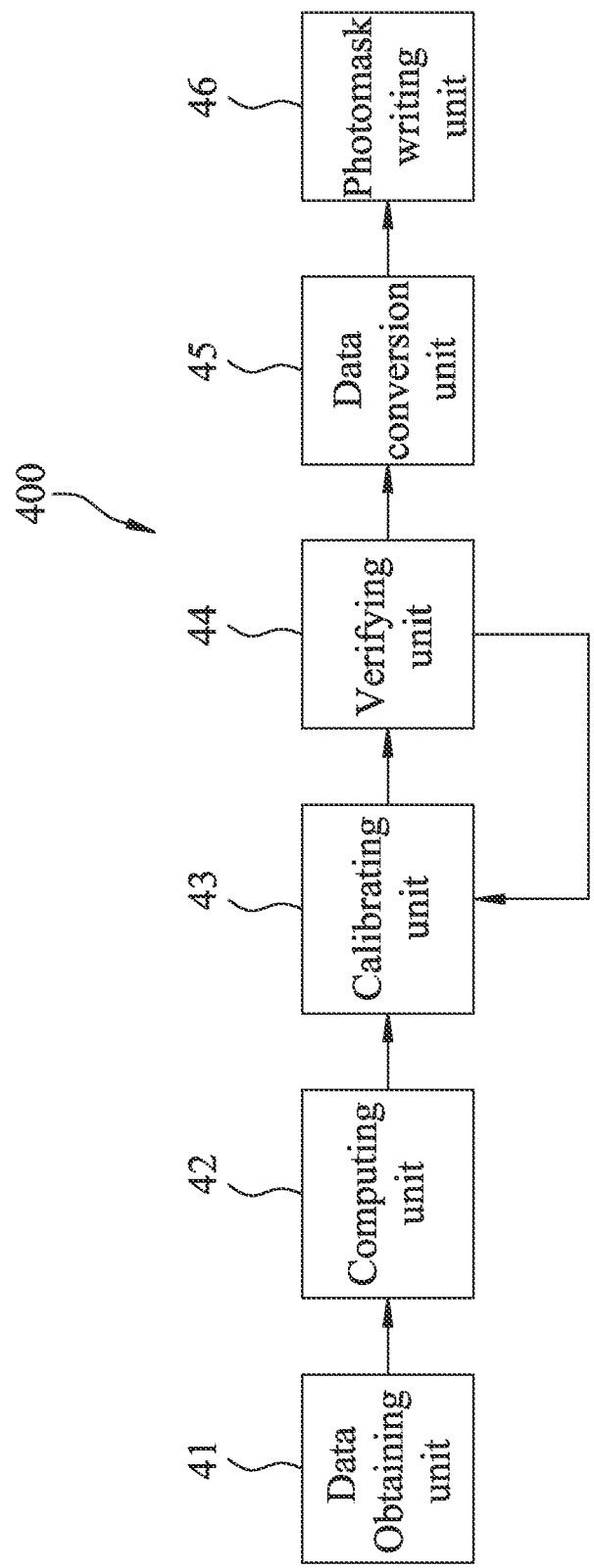
FIG. 10 is a block diagram of a system for generating a photomask according to one embodiment of the disclosure.

FIG. 10 is a block diagram of a system 400 for generating a photomask according to one embodiment of the disclosure. The system 400 differs from the system 200 in FIG. 2 in that the system 400 further includes a data conversion unit 45 and a photomask writing unit 46.

The data conversion unit 45 is coupled to the calibrating unit 43 via the verifying unit 44, and may be embodied using a processor executing a graphic data system (GDS) software. The data conversion unit 45 is configured to convert the calibrated area into a data file in a data stream format for data exchange, such as a GDSII file, an MEBES file, etc.

The photomask writing unit 46 is coupled to the data conversion unit 45, and may be embodied using an e-beam writing system that is configured to receive the data file and to generate a calibrated photomask that corresponds with the calibrated area based on the data file. The calibrated photomask thus generated may then be used for fabrication of new semiconductor devices with the overlay errors compensated for.

Figure 9:
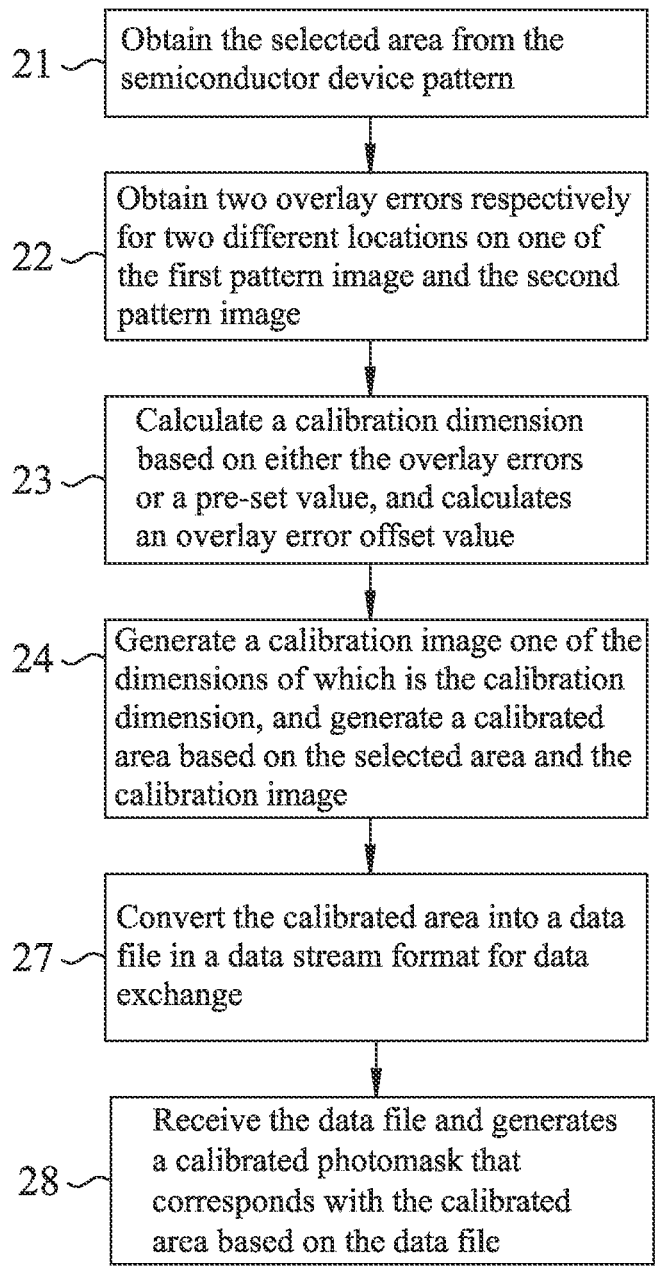
FIG. 9 is a flow chart illustrating steps of a method for generating a photomask according to one embodiment of the disclosure.

FIG. 9 is a flow chart illustrating steps of a method for generating a photomask according to one embodiment of the disclosure. In this embodiment, the method is implemented using the system 400 of FIG. 10.

In the method of FIG. 9, steps 21 to 24 of the method of FIG. 1 are first implemented, so as to generate a calibrated area. The details of the steps 21 to 24 are not repeated herein for the sake of brevity.

Afterward, in step 27, the data conversion unit 45 converts the calibrated area into a data file in a data stream format for data exchange. Then, in step 28, the photomask writing unit 46 receives the data file and generates a calibrated photomask that corresponds with the calibrated area based on the data file.

It is noted that in some embodiments, the operations of steps 25 and 26 (see FIG. 1) are also implemented between steps 24 and 27.

To sum up, the embodiments of the disclosure provide a method and a system for overlay control based on a semiconductor device pattern. By the operations of measuring overlay errors individually for two different locations on one of the first pattern image 311 and the second pattern image 312, and calculating the calibration dimension based on either the overlay errors or the pre-set value, the system 200 is capable of generating a calibration image based on the calibration dimension, and generating a calibrated area based on the selected area 30 and the calibration image. In this manner, the measurement of the overlay errors may be more accurate and may overcome the limitations (e.g., scale) of the equipment used for measurement. Additionally, the calibrated area may then be used to create a photomask for subsequent fabrication of new semiconductor devices with better layer-to-layer arrangement (that is, with the measured overlay errors compensated for).

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for overlay control based on a semiconductor device pattern, the method being implemented using a system and comprising:

obtaining a selected area from the semiconductor device pattern, the semiconductor device pattern including a wiring pattern section with a first pattern image and a second pattern image that are images of two wiring patterns formed in different steps in a semiconductor fabrication process;

obtaining two overlay errors respectively for two different locations associated with the first pattern image and the second pattern image;

calculating a calibration dimension based on either the overlay errors or a pre-set value; and generating a calibration image with one dimension thereof equaling the calibration dimension, and generating a calibrated area based on the selected area and the calibration image.

2. The method of claim 1, wherein the obtaining two overlay errors includes obtaining two overlay errors respectively on two side points on the wiring pattern section.

3. The method of claim 1, each of the wiring pattern that corresponds to the first or second pattern image including a plurality of wiring parts, the semiconductor device pattern further including a non-wiring section depicting a supporting material that is distributed among the first pattern image and the second pattern image, wherein the generating of a calibrated area includes one of inserting the calibration image in the selected area, and removing at least one part of the selected area with a size identical to that of the calibration image.

4. The method of claim 1, wherein:

the calibration dimension is calculated by dividing either a difference between the overlay errors or the pre-set value by a number (P*n), where P represents a predetermined resolution associated with an electron beam used for obtaining the semiconductor device pattern, or a resolution associated with a size of a pixel, and n is a positive integer;

the generating of the calibrated area includes dividing the selected area along a direction into a number (m) of divided sections, the number (m) satisfying the following relations:

$$|(m*n*P)-E|<n*P; \text{ and}$$

$$(m-1)*nP<E<(m+1)*nP,$$

where E represents either the difference between the two overlay errors or the pre-set value, and generating the calibrated area by one of inserting the calibration image in one of the divided sections, and removing one or more parts, each with a size identical to that of the calibration image, from one of the divided sections.

5. The method of claim 1, the selected area including a plurality of wiring pattern sections and a plurality of non-wiring pattern sections, wherein:

the generating of the calibrated area includes defining a reference line on the selected area, the reference line extending across at least one of the wiring pattern sections, and generating the calibrated area by one of inserting the calibration image at a calibration position in proximity to the reference line within the at least one of the wiring pattern sections, and removing at least one part having a size identical to that of the calibration image from the at least one of the wiring pattern sections at the calibration position.

6. The method of claim 5, the wiring pattern that corresponds to each of the first pattern image and the second pattern image of each of the wiring pattern sections including a plurality of wiring parts, the semiconductor device pattern further including a non-wiring section that depicts a supporting material and that is distributed among the wiring parts, wherein the generating of the calibration image includes generating a characteristic of the calibration image based on whether the reference line extends through a wiring part in one of the first pattern image and the second pattern image, or extends through a non-wiring section.

7. The method of claim 5, wherein:

the reference line extends along an interface of another one of the wiring pattern sections other than the at least one of the wiring pattern sections and one of the non-wiring pattern sections;

the generating of the calibration image includes generating the calibration image to have a characteristic that corresponds with one of the another one of the wiring pattern sections and the one of the non-wiring pattern sections; and the generating of the calibrated area further includes one of inserting the calibration image at a calibration position in proximity to the interface, and removing at least one part having a size identical to that of the calibration image, from the calibration position.

8. The method of claim 4, wherein the number (ma) is equal to or greater than two, and the generating of a calibrated area includes inserting at least two calibration images in the selected area.

9. The method of claim 3, further comprising determining a difference between the selected area and the calibrated area in terms of the first pattern image and the second pattern image.

10. The method of claim 1, further comprising, after generating the calibrated area, performing a size adjustment operation on at least one of the first pattern image or the second pattern image of the calibrated area that has a size thereof altered during the generating of the calibrated area.

11. A system for overlay control based on a semiconductor device pattern, comprising:

a data obtaining unit that is configured to obtain data of a selected area from the semiconductor device pattern, the semiconductor device pattern including a wiring section with a first pattern image and a second pattern image that are images of two wiring patterns formed in different steps in a semiconductor fabrication process;

a computing unit that is configured to obtain two overlay errors respectively for two different locations on one of the first pattern image and the second pattern image, and to calculate a calibration dimension based on either the overlay errors or a pre-set value;

a calibrating unit that is configured, to generate a calibration image with one dimension thereof equaling the calibration dimension, and to generate a calibrated area based on the selected area and the calibration image.

12. The system of claim 11, further comprising a photomask writing unit that is coupled to said data conversion unit and that is configured to receive the data file and to generate a calibrated photomask that corresponds with the calibrated area based on the data file.

13. The system of claim 11, further comprising a verifying unit that is configured to determine a difference between the selected area and the calibrated area in terms of the first pattern image and the second pattern image.

14. A method for overlay control based on a semiconductor device pattern, the semiconductor device pattern being a simulated image of a semiconductor device in a specific stage of semiconductor fabrication process, the simulated image including a wiring section with a first pattern image and a second pattern image that are images of two wiring patterns formed in different steps in a semiconductor fabrication process, the method being implemented using a system and comprising:
- obtaining two overlay errors associated with the first pattern image and the second pattern image on two different locations;
- calculating a calibration dimension based on either the overlay errors or a pre-set value; and
- generating a calibration image with one dimension thereof equaling the calibration dimension, and generating a calibrated area based on the selected area and the calibration image.

15. The method of claim 14, further comprising, after generating the calibrated area, performing a size adjustment operation on at least one of the first pattern image or the second pattern image of the calibrated area that has a size altered during the generating of the calibrated area.

\* \* \* \* \*